United States Patent [19]

Katz

[11] Patent Number: 5,051,745
[45] Date of Patent: Sep. 24, 1991

[54] STRING SEARCHER, AND COMPRESSOR USING SAME

[75] Inventor: Phillip W. Katz, Glendale, Wis.

[73] Assignee: PKWare, Inc., Brown Deer, Wis.

[21] Appl. No.: 570,433

[22] Filed: Aug. 21, 1990

[51] Int. Cl.[5] .................. H03M 7/30; G06F 15/40
[52] U.S. Cl. ...................................... 341/51; 341/65;
341/67; 341/106; 364/200
[58] Field of Search .............. 341/51, 65, 67, 50,
341/95, 106; 364/200, 900

[56] References Cited

U.S. PATENT DOCUMENTS

| | | | |
|---|---|---|---|
| 4,558,302 | 12/1985 | Welch | 341/51 |
| 4,730,348 | 3/1988 | MacCrisken | 364/200 |
| 4,961,139 | 10/1990 | Hong et al. | 364/200 |

Primary Examiner—A. D. Pellinen
Assistant Examiner—Sharon D. Logan
Attorney, Agent, or Firm—Fuller, Ryan & Hohenfeldt

[57] ABSTRACT

Methods and apparatus for string searching and data compression. In the string search method and apparatus pointers to the string to be searched are indexed via a hashing function and organized according to the hashing values of the string elements pointed to. The hashing function is also run on the string desired to be found, and the resulting hashing value is used to access the index. If the resulting hashing value is not in the index, it is known that the target string does not appear in the string being searched. Otherwise the index is used to determine the pointers which correspond to the target hashing value, these pointers pointing to likely candidates for matching the target string. The pointers are then used to sequentially compare each of the locations in the string being searched to the target string, to determine whether each location contains a match to the target string. In the method and apparatus for compressing a stream of data symbols, a fixed length search window, comprising a predetermined contiguous portion of the symbol stream, is selected as the string to be searched by the string searcher. If a string to be compressed is found in the symbol stream, a code is output designating the location within the search window of the matching string and the length of the matching string.

12 Claims, 2 Drawing Sheets

STRING SEARCHER, AND COMPRESSOR USING SAME

BACKGROUND OF THE INVENTION

This invention relates to string search methods and apparatus, and particularly those string search methods and apparatus as used in compression and encoding methods and apparatus.

There are many data compression and encoding methods and apparatus known today. Due to the everincreasing need to transmit and/or store greater and greater amounts of data, however, there is continued demand for increasingly improved data compression and encoding, both in terms of improved speed and reduced memory requirements, and above all in terms of greater compression efficiency. This demand can be seen by comparing Eastman et al., U.S. Pat. No. 4,464,650, with Welch, U.S. Pat. No. 4,558,302. From these two patents, and the references cited therein, it can be seen that work continues in the area of data compression and encoding.

The methods disclosed in the two patents above are described by some in the industry as Ziv-Lempel compression and Ziv-Lempel-Welch compression, respectively. Both of these methods are based on storage of recurring strings in tree form, requiring adding a new "leaf" node with the occurrence of a string not previously encountered. Another class of methods which may have certain advantages over either of the methods set forth above is described as "sliding window" data compression, wherein compression is achieved by comparing a certain string to be compressed to earlier portions of the string and reproducing the current string merely by referring to any similar earlier portions of the string found by the comparison. Since the earlier portions of the string need to be searched, however, to determine whether the subject string is repeated or not, efficient string searching becomes of greater importance.

This invention relates to improvements over the apparatus described above and to solutions to the problems raised or not solved thereby.

SUMMARY OF THE INVENTION

The invention provides a string search method and apparatus wherein pointers to the string to be searched are indexed by means of a hashing function which calculates hashing value for each symbol, and then arranging the pointers according to the hashing value of the symbol pointed to by each. The hashing function is also run on the string desired to be found, and the resulting hashing value is used to access the index. If the resulting hashing value is not defined in the index or is null, a response is sent to the effect that the target string does not appear in the string being searched. If the target hashing value is defined and not null, the index is used to determine the pointers which correspond to the target hashing value, these pointers pointing to likely candidates for matching the target string. The target string is then sequentially compared by a comparator to each of the locations in the string being searched, as pointed to by each of the corresponding pointers, to determine whether each location contains a match to the target string.

The invention also provides a data compressor for compressing a stream of data symbols, by use of the above string searcher. A finite, substantially fixed length search window, comprising a predetermined contiguous portion of the symbol stream, is selected. This window is established as the string to be searched by the string searcher. Hence, for each of the symbols in the search window, the pointer array includes one pointer. Using the hashing function, the pointer array is organized and the index to the pointer array is created. A portion of the symbol stream, whether or not within the search window, is selected by some means as the target symbol string to be compressed. The hashing function is then again used, this time on the target symbol string to obtain a target symbol string hashing value. The comparator then compares the target string to the locations in the search window pointed to by the pointers corresponding to the target symbol string hashing value as an index value, and determines whether a matching string of symbols exists in the search window other than the target string itself. If a matching string is found, a code is output that designates the location within the search window of the matching string and the length of the matching string. If no matching string is found, a code is output designating a portion of the target string directly, and the string is re-selected. In either case, this output code may be encoded further, by means such as Huffman encoding or Shannon-Fano encoding, to gain further compression.

Other objects and advantages of the invention will become apparent hereinafter.

DESCRIPTION OF THE PREFERRED EMBODIMENT

Figure 1:
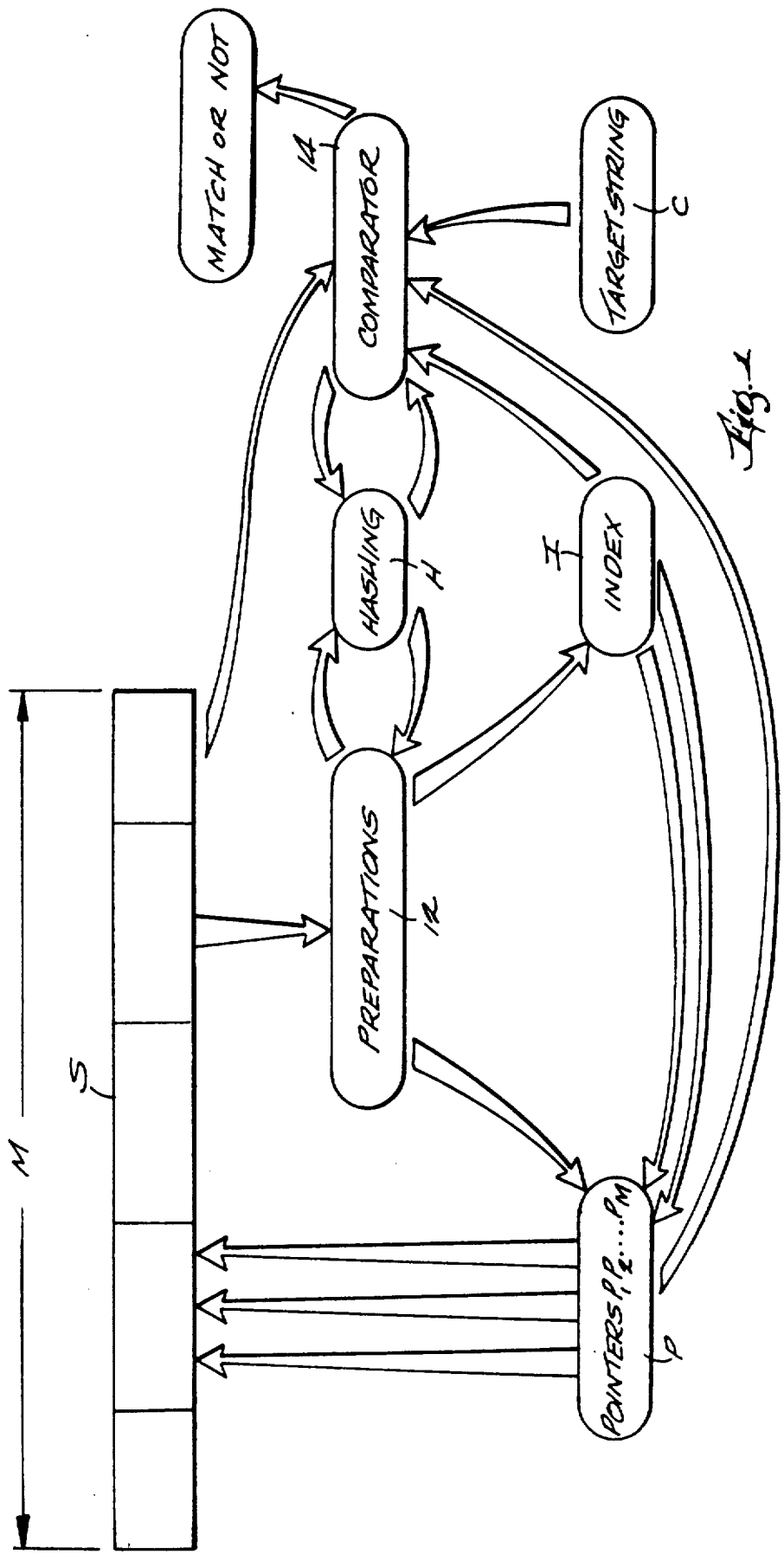
FIG. 1 is a schematic flow diagram showing a text search method and apparatus according to a preferred embodiment of the invention.

Referring now to FIG. 1, there is shown a contiguous vector or string S, of M characters in length. The invention provides a method and apparatus to search for or locate a particular target string C of symbols within this string S. This search string S is prepared for searching by a preparation means 12. According to the invention, preparation means 12 generates a pointer array P having one pointer $P_1, P_2, \ldots P_M$ for each of the symbols 1, 2, $\ldots$ M in the search string S. This pointer array P is created by the preparation means 12 by use of a hashing function $H(S,t)$, with t being limited by $0 <= t <= M-K$, where K is the number of characters required to operate the hashing function. For each element S[t] of the string S, the preparation means 12 calculates the value of $H(S,t)$, and then organizes the hash values in order of their value, so that all pointers of characters having the same hash value are stored together, adjacently. This organization can be done, for instance, by means of sorting. Hence there is within the pointer array P a separate pointer for each element of the string S, and the order in which the pointers are stored within the array is that of the hash values of the elements of the string S. That is, all those pointers pointing to elements with duplicate hash values will be stored adjacent to each other.

The preparation means 12 then creates an index I to access the pointer array P, again using the hashing function, the index I being an array of pointers into the pointer array P, there being one entry in index I for each value of the hashing function H(S,t). Described another way, H(S,P[I[x]]) through H(S,P[I[x]+n−1]) all result in the value x for all values of x where I[x] is defined. Each entry in index I points to the first element in pointer array P whose element in S has the hashing value corresponding that entry in the index I. If the value x does not occur as a result of H(S,t) over the entire string S, then I[x] is null or undefined.

Hence the index I has substantially fewer values than the pointer array P, mapped more or less evenly, depending upon the hashing function selected. Any suitable hashing function could be used for this outcome. For instance, the sum of the values of the first K (K often being 2 or 3) characters could be used. Alternatively, the values of some characters summed with multiples of the values of others of the characters could be used, such a hashing function giving more possible hashing values and possibly a better distribution. The particular hashing function used is not as important as the requirement that the hashing function used be relatively efficient, that is, uniform in its distribution.

Once the search string S is prepared by the preparation means 12, the string C is located within the string by the comparator 14. This is done by calculating the hashing value of the first K characters of the string C, the hashing function requiring that the string be at least K characters long. If the value of H(C,0) is undefined or null, that is, if I[H(C,0)] does not exist, or stated yet another way if there is no entry in the index I corresponding to the hashing value of the first K characters of the string C, then C does not appear in the string S at all, and the comparator can send a message to that effect. If on the other hand I[H(C,0)] is defined, that is, if the index I contains an entry corresponding to the hashing value of the first K characters of C, then the resulting index value is used to find the pointer within pointer array P to the first occurrence of K characters in the search string S having the same hashing value. All subsequent pointers within pointer array P, with the same hashing values, (Recall that pointer array P was organized so that all such pointers are stored together) will also point to additional occurrences of K characters with the same hashing value, located in other areas of the search string S. Stated another way, if I[H(C,0)] is neither undefined nor null, then locations S[P[I[H(C,0)]]], S[P[I[H(C,0)+1]]], . . . S[P[I[H(C,0)+n−1]]] are all likely candidates for matching the first K characters of C, since they all have the same hashing value. Once these locations are determined, each of them can then be compared by the comparator 14 to the target string C, using conventional matching techniques, to determine whether the symbols or characters in the locations actually match the target string. When a match is found, a message can be output as to the particular location or locations within the search string S where the match exists.

While the above string searching method and apparatus have many advantageous applications, they are particularly advantageously applied to data compression, or data encoding for the purpose of reducing the space required to store the data.

Figure 2:
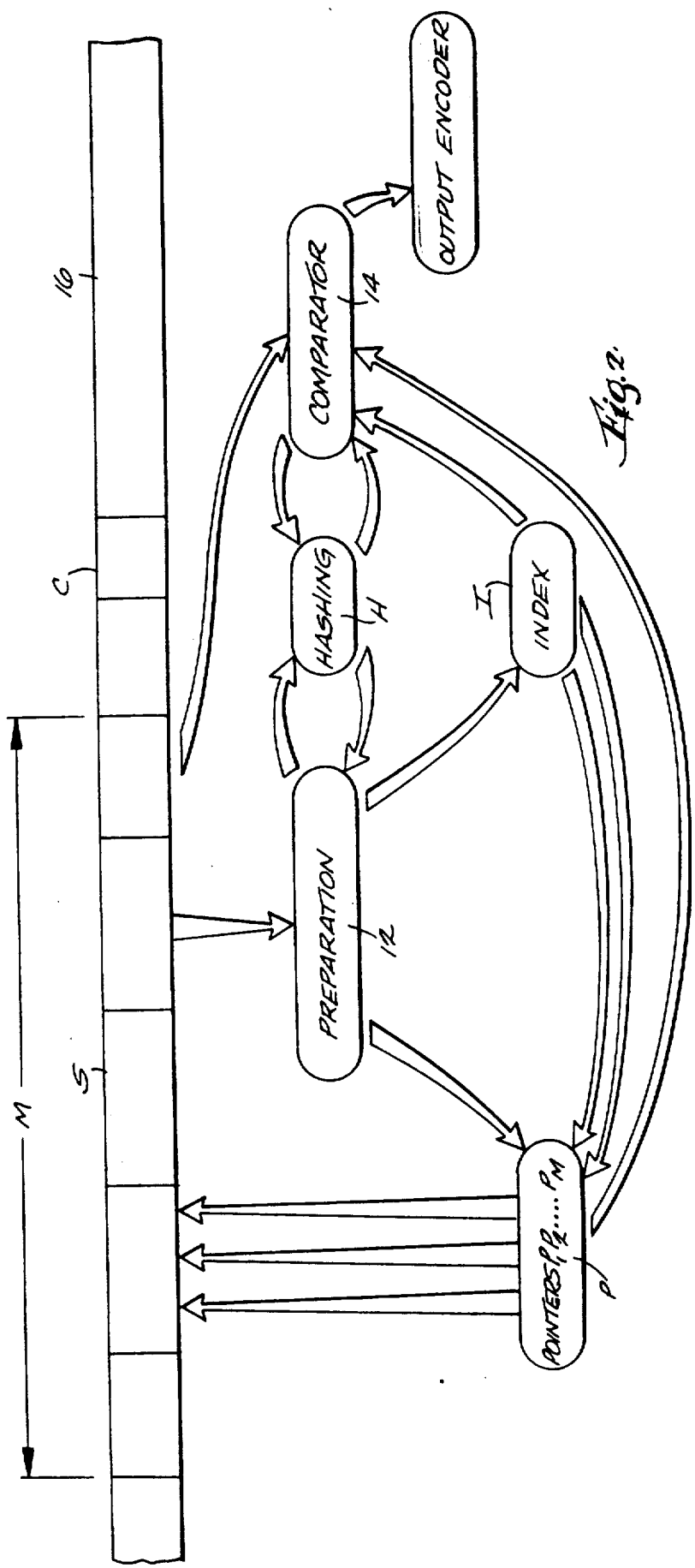
FIG. 2 is a schematic flow diagram showing a compression method and apparatus including the text search method and apparatus shown in FIG. 1.

Hence, referring now to FIG. 2, in a data compression method and apparatus directed to compressing a continuous stream of data symbols 16 of indeterminate length, a finite, substantially fixed length search window S of length M is selected, to which the above described string search method and apparatus is to be applied. Such a search window S is generally a predetermined contiguous portion of the symbol stream 16. The hashing function is then applied to each symbol within this window S of the stream 16, to arrive at the pointer array P and index I as described above. A portion of the data symbol stream 16 is then selected by some suitable means as a target symbol string C for compression. This target symbol string C may or may not be located within the window S itself. The hashing function H is again applied to this target symbol string C to arrive at a target symbol string hashing value, at least for the first K characters of the target string. As with the method and apparatus of the string searcher set forth above, this target symbol string hashing value is used to access the pointer array P through the index I, to obtain locations of likely candidates for matching the target symbol string C within the search window S. If no match is found by the comparator 14, the target search string C itself, or at least some minimal substring thereof, is output directly, and the target string C is re-selected. If a match is indeed found by the comparator 14, then, instead of outputting a string, merely the location and length of the matching string within the search window S is output, resulting in the space saving usually associated with sliding window data compression, but at much improved speed over that available in the prior art.

In order to achieve even greater compression, the output of the comparator 14 described immediately above may be encoded still further by suitable means, such as by means of arithmetic encoding, Huffman encoding, or by use of a Shannon-Fano tree. As is well known, Huffman codes are minimum redundancy variable length codes, as described by David A. Huffman in an article entitled "A Method for Construction of Minimum Redundancy Codes", in The Proceedings of the I.R.E., 1952, Volume 40, pages 1098 to 1101. Shannon-Fano encoding also makes use of variable length codes, and was described by Gilbert Held in the treatise "Data Compression, Techniques and Applications, Hardware and Software Considerations", 2d Edition, 1987, Wiley & Sons, at pages 107 to 113. The disclosures of both of these references are hereby incorporated herein by reference. The latter reference also includes a comparison of Shannon-Fano encoding to Huffman encoding While the apparatus hereinbefore described is effectively adapted to fulfill the aforesaid objects, it is to be understood that the invention is not intended to be limited to the specific preferred embodiment of string searching method and apparatus and data compression method and apparatus set forth above. Rather, it is to be taken as including all reasonable equivalents within the scope of the following claims.

I claim:

1. A method for searching a vector of symbols for a predetermined target string, comprising:
   generating a pointer array having one pointer for each of the symbols in the vector;
   calculating, by means of a hashing function, the hashing value of each of the symbols, and arranging the pointer array in order of hashing value of the respective symbol, the hashing function being chosen so that there are fewer hashing values than there are pointers in the pointer array;
   generating an index of the pointers in the pointer array, that index having only as many entries as there are possible hashing values, and therefore substantially fewer entries than the pointer array;

applying the hashing function to the target string, to generate a target hashing value; and if the target hashing value is not defined or is null, sending a response that the target string does not appear in the vector;

if the target hashing value is defined and not null, using the index to determine those pointers to symbols having hashing values which are equal to the target hashing value, and sequentially comparing the target string to each of the locations in the vector pointed to by each of the corresponding pointers, to determine whether each location contains a match to the target string 2. A method as recited in claim 1 wherein the hashing function requires that the string to be hashed be at least 2 symbols long.

3. A method as recited in claim 1 wherein the hashing function requires that the string to be hashed be no more than 3 symbols long.

4. A string searcher for searching an existing vector of symbols for the existence a target string, comprising:
   a hashing function for accepting an input and providing a hashing value, and permitting several inputs to have the same hashing value;
   a pointer array having one pointer for each of the symbols in the vector, said pointer array being arranged in order of the hashing values of the symbols pointed to;
   an index, having one entry for each value generated by the hashing function, and having substantially fewer entries than the pointer array;
   a target string hashing value obtained by operating the hashing function on the target string;
   a comparator for comparing the target string to locations in the vector pointed to by the pointers corresponding the target string hashing value as an index value, and for determining whether a match exists.

5. A method as recited in claim 4 wherein the hashing function requires that the string to be hashed be at least 2 symbols long.

6. A method as recited in claim 4 wherein the hashing function requires that the string to be hashed be no more than 3 symbols long.

7. A data compressor for compressing a stream of data symbols, comprising:
   a finite, substantially fixed length search window, comprising a predetermined contiguous portion of the symbol stream;
   a hashing function for accepting an input and providing a hashing value, said hashing function permitting several inputs to have the same hashing value;
   a pointer array having one pointer for each of the symbols in the search window, said pointer array being arranged in order of the hashing values of the data symbols pointed to;
   an index into said pointer array, having one entry for each value generated by the hashing function, and having substantially fewer entries than the pointer array;
   means for selecting a portion of the symbol stream as the target symbol string to be compressed;
   a target symbol string hashing value obtained by operating the hashing function on the target symbol string;
   a comparator for comparing the target string to locations in the search window pointed to by the pointers corresponding to the target symbol string hashing value as an index value, and for determining whether a matching string of symbols exists in the search window;
   means for outputting a code such that, if a matching string is found, that code designates the location within the search window of the matching string and the length of the matching string and, if no matching string is found, that code designates the target string directly.

8. A data compressor as recited in claim 7 further comprising means for Huffman encoding said code output by said outputting means.

9. A data compressor as recited in claim 7 further comprising means for Shannon-Fano encoding said code output by said outputting means.

10. A method of encoding a stream of data symbols, comprising:
    selecting a finite, substantially fixed length search window, as a predetermined contiguous portion of the symbol stream;
    providing a hashing function which accepts an input and generates a hashing value, and which permits several inputs to have the same hashing value;
    generating a pointer array having one pointer for each of the symbols in the search window;
    arranging said pointer array in order of the hashing values of the symbols pointed to;
    generating an index having one entry for each value generated by the hashing function, that index having substantially fewer entries than pointers in the pointer array;
    selecting a portion of the symbol stream as a target symbol string to be encoded;
    operating the hashing function on the target symbol string to obtain a target symbol string hashing value;
    comparing the target symbol string to locations in the search window pointed to by the pointers corresponding to the target symbol string hashing value as an index value, and determining whether a matching string of symbols exists in the search window;
    if a matching string is found, outputting a code designating the location within the search window of the matching string and the length of the matching string;
    if no matching string is found, outputting the target string.

11. A method as recited in claim 10 further comprising Huffman encoding said output code.

12. A method as recited in claim 10 further comprising Shannon-Fano encoding said output code.

* * * * *